(12) United States Patent
Hoshino et al.

(10) Patent No.: US 8,030,179 B2
(45) Date of Patent: Oct. 4, 2011

(54) SEMICONDUCTOR DEVICE AND METHOD OF MANUFACTURING THE SAME

(75) Inventors: Masataka Hoshino, Kanagawa (JP); Junichi Kasai, Kanagawa (JP); Kouichi Meguro, Kanagawa (JP); Ryota Fukuyama, Kanagawa (JP); Yasuhiro Shinma, Kanagawa (JP); Koji Taya, Kanagawa (JP); Masanori Onodera, Kanagawa (JP); Naomi Masuda, Kanagawa (JP)

(73) Assignee: Spansion, LLC, Sunnyvale, CA (US)

( * ) Notice: Subject to any disclaimer, the term of this patent is extended or adjusted under 35 U.S.C. 154(b) by 149 days.

(21) Appl. No.: 12/556,408

(22) Filed: Sep. 9, 2009

(65) Prior Publication Data

US 2009/0325346 A1 Dec. 31, 2009

Related U.S. Application Data

(60) Division of application No. 11/636,155, filed on Dec. 7, 2006, now Pat. No. 7,605,457, which is a continuation of application No. PCT/JP2005/022646, filed on Dec. 9, 2005.

(51) Int. Cl.
*H01L 21/00* (2006.01)
*H01L 21/4763* (2006.01)

(52) U.S. Cl. ........ 438/460; 438/462; 438/622; 438/667; 257/E21.575; 257/E21.599

(58) Field of Classification Search .............. 438/460, 438/462, 618, 622, 667; 257/E21.575, E21.599
See application file for complete search history.

(56) References Cited

U.S. PATENT DOCUMENTS

| | | | | |
|---|---|---|---|---|
| 5,606,198 | A * | 2/1997 | Ono et al. | 257/666 |
| 6,743,696 | B2 * | 6/2004 | Jeung et al. | 438/458 |
| 6,855,572 | B2 * | 2/2005 | Jeung et al. | 438/106 |
| 7,585,750 | B2 * | 9/2009 | Do et al. | 438/462 |
| 7,605,457 | B2 | 10/2009 | Hoshino et al. | |
| 7,633,159 | B2 * | 12/2009 | Boon et al. | 257/730 |
| 2004/0157410 | A1 * | 8/2004 | Yamaguchi | 438/460 |

* cited by examiner

*Primary Examiner* — Michael Trinh

(57) ABSTRACT

The present invention provides a semiconductor device that includes: stacked semiconductor chips, each semiconductor chip including a semiconductor substrate and a first insulating layer that is provided on side faces of the semiconductor substrate and has concavities formed on side faces thereof; first metal layers that are provided in center portions of inner side faces of the concavities; and second metal layers that are provided in the concavities and are connected to the first metal layers formed on each semiconductor chip. The present invention also provides a method of manufacturing the semiconductor device.

9 Claims, 14 Drawing Sheets

SEMICONDUCTOR DEVICE AND METHOD OF MANUFACTURING THE SAME

CROSS-REFERENCES TO RELATED APPLICATIONS

This application is a divisional of U.S. patent application Ser. No. 11/636,155, filed on Dec. 7, 2006, entitled "Semiconductor Device and Method of Manufacturing the same," which is a continuation in part of international application number PCT/JP2005/022646 which are hereby incorporated herein by reference in their entirety.

FIELD OF THE INVENTION

The present invention relates to a semiconductor device and a method of manufacturing the semiconductor device, and more particularly, to a semiconductor device that is formed with stacked semiconductor chips and a method of manufacturing the semiconductor device.

BACKGROUND OF THE INVENTION

In recent years, there has been an increasing demand for smaller semiconductor devices that can be used as non-volatile memory media for portable electronic devices such as portable telephone devices and IC memory cards. In this trend, techniques of efficiently packaging semiconductor chips have been developed. As one of such techniques, there is a method of packaging stacked semiconductor chips.

Japanese Patent Application Publication No. 2004-342861 discloses the following technique (conventional technique 1). Firstly, grooves are formed on the upper face of a semiconductor wafer, and an insulating layer is embedded in the grooves. Through holes having conductors embedded therein are then formed in the insulating layer. The through holes are cut so as to divide the semiconductor wafer into semiconductor chips. The through holes become concavities formed on the side faces of the semiconductor chip, and the conductors formed in the through holes electrically connect the upper face and the lower face of the semiconductor chip.

Japanese Patent Application Publication No. 2004-221372 discloses the following technique (conventional technique 2). Through holes having side walls covered with conductors are formed in a semiconductor wafer. The through holes are cut so as to divide the semiconductor wafer into semiconductor chips. The semiconductor chips are stacked, and metal resin layers are formed in the concavities formed from the through holes in the side faces of the semiconductor chips. The stacked semiconductor chips are electrically connected to one another via the metal resin layers formed in the concavities.

Japanese Patent Application Publication No. 2001-250906 discloses the following technique (conventional technique 3). After semiconductor chips are stacked, wiring patterns are formed on the side faces of the stacked semiconductor chips. The stacked semiconductor chips are electrically connected to one another via the wiring patterns.

As in the conventional technique 1 and the conventional technique 2, however, the following problems are caused in a case where through holes are formed in a semiconductor wafer and are cut to divide the semiconductor wafer into semiconductor chips. Since the conductors that are embedded in the through holes or cover the side walls of the through holes are cut, the conductors are likely to come off when the wafer is divided into chips. Also, to form through holes in a semiconductor wafer or an insulating layer, deep etching needs to be performed. This is technologically difficult, and results in higher production costs. In the conventional technique 3, wiring patterns are formed in semiconductor chips after the semiconductor chips are stacked. As a result, the production costs become higher.

SUMMARY OF THE INVENTION

The present invention has been made in view of the above circumstances and provides a semiconductor device that has metal layers that can be formed on side faces of stacked semiconductor chips at low costs and electrically connect the semiconductor chips to one another. The present invention also provides a method of manufacturing such a semiconductor device.

According to a first aspect of the present invention, there is provided a semiconductor device including: a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips. The concavities are formed in the first insulating layer. Accordingly, the formation of these concavities is easier than the formation of concavities in a semiconductor substrate. Also, since the first metal layers are formed in the center portions of the concavities, removal of the first metal layers can be prevented when through holes are cut. Thus, a semiconductor device that has second metal layers that electrically connect the semiconductor chips and can be formed at low costs can be provided.

According to another aspect of the present invention, there is provided a semiconductor device including: a plurality of stacked semiconductor chips, at least one of the semiconductor chips including a semiconductor substrate, a first insulating layer that is provided on side faces and an upper face of the semiconductor substrate, first metal layers that are provided on side faces and an upper face of the first insulating layer, and a second insulating layer that is provided on upper faces of the first metal layers and side faces of the first insulating layer and has concavities on side faces thereof; and second metal layers that are provided in the concavities and are connected to the first metal layers formed on the at least one of the semiconductor chips, the second metal layers being connected to the first metal layers through the concavities. The concavities are formed in the first insulating layer. Accordingly, the formation of these concavities is easier than the formation of concavities in a semiconductor substrate. Also, since the first metal layers are formed in the center portions of the concavities, removal of the first metal layers can be prevented when through holes are cut. Further, electric contact between the upper semiconductor chip of the stacked semiconductor chips and the first metal layers can be prevented. Further, when the second insulating layer is formed, the second insulating layer can be prevented from not covering the first metal layers due to poor accuracy of alignment. Thus, it is possible to provide a semiconductor device that has second metal layers that electrically connect the semiconductor chips and can be formed at low costs.

According to another aspect of the present invention, there is provided a semiconductor device including a package that has a built-in semiconductor device mounted therein, the built-in semiconductor device being the above-described semiconductor device.

According to another aspect of the present invention, there is provided a method of manufacturing a semiconductor device including: forming first grooves on an upper face of a semiconductor wafer; forming a first insulating layer that covers the upper face of the semiconductor wafer and side faces of the first grooves, and has second grooves that are formed in the first grooves and has concavities on side faces thereof; forming first metal layers on side faces of the concavities; and dividing the semiconductor wafer into a plurality of semiconductor chips by removing a bottom portion of the semiconductor wafer until the removal reaches bottom faces of the second grooves. Through holes are not formed, and accordingly, there is no need to perform the etching for forming through holes. Thus, the production costs can be lowered. Also, the bottom portion of the semiconductor substrate is removed to divide the semiconductor wafer into semiconductor chips, without the dicing of the metal layers. Thus, the first metal layers can be prevented from coming off.

According to another aspect of the present invention, there is provided a method of manufacturing a semiconductor device including: forming first grooves on an upper face of a semiconductor wafer; forming a first insulating layer that covers the upper face of the semiconductor wafer and side faces of the first grooves, and has second grooves that are formed in the first grooves, forming first metal layers on an upper face and side faces of the first insulating layer; forming a second insulating layer that covers the upper face of the first insulating layer and side faces of the second grooves, and has third grooves that are formed in the second grooves and has concavities on side faces thereof; with the first metal layers being exposed through the concavities; and dividing the semiconductor wafer into a plurality of semiconductor chips by removing a bottom portion of the semiconductor wafer until the removal reaches bottom faces of the third grooves. Through holes are not formed, and accordingly, there is no need to perform the etching for forming through holes. Thus, the production costs can be lowered. Also, the bottom portion of the semiconductor substrate is removed to divide the semiconductor wafer into semiconductor chips, without the dicing of the metal layers. Thus, the first metal layers can be prevented from coming off. Further, as the second insulating layer covers the first metal layers except for the portions exposed through the concavities, short-circuiting due to misalignment can be prevented between the first metal layers and the semiconductor substrate located above the first metal layers.

DESCRIPTION OF THE PREFERRED EMBODIMENTS

A description will now be given, with reference to the accompanying drawings, of embodiments of the present invention.

First Embodiment

Figure 1:
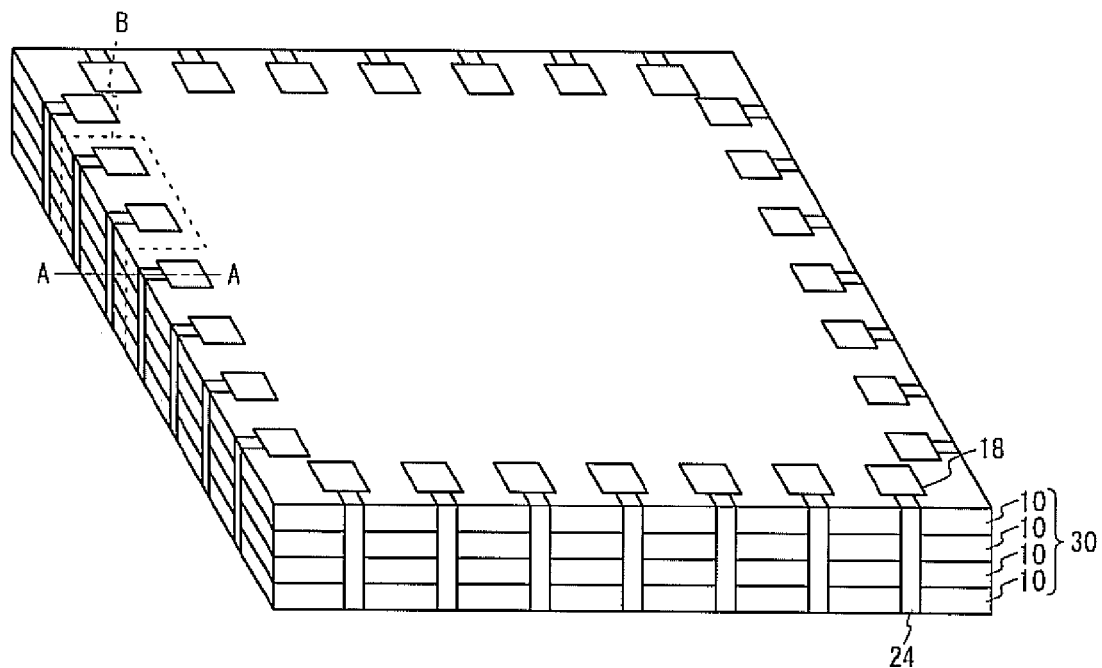
FIG. 1 is a perspective view of a semiconductor device in accordance with an embodiment of the present invention.
Figure 2:
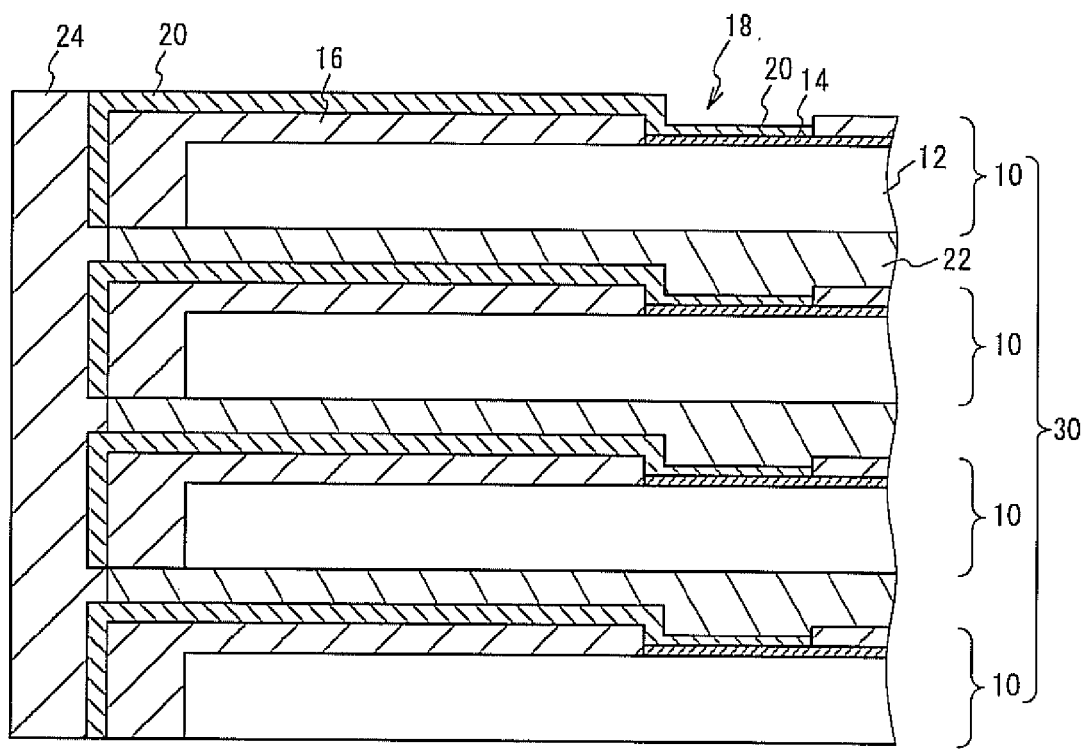
FIG. 2 is a cross-sectional view of the semiconductor device, taken along the line A-A of FIG. 1, in accordance with an embodiment of the present invention.

A first embodiment is an example of a structure formed with stacked semiconductor chips. FIG. 1 is a perspective view of a semiconductor device in accordance with the first embodiment. FIG. 2 is a cross-sectional view of the semiconductor device, taken along the line A-A of FIG. 1. As shown in FIG. 1, the semiconductor device includes stacked semiconductor chips 10 having circuits formed therein. In the example described in the following, four semiconductor chips 10 are stacked, but the present invention can be applied to any semiconductor device that are formed with more than four or less than four stacked semiconductor chips 10. Pad units 18 are formed on the upper surface of the stack of the semiconductor chips 10. Second metal layers 24 are formed on the side faces of each semiconductor chip 10.

As shown in FIG. 2, each stacked semiconductor chip 10 includes a semiconductor substrate 12 and a first insulating layer 16 formed on the side faces and the upper face of the semiconductor substrate 12. Pad electrodes 14 are formed on the semiconductor substrate 12. A first metal layer 20 is formed on the first insulating layer 16 and the side faces of the first insulating layer 16. The first metal layer 20 is electrically connected to the pad electrodes 14 in an opening formed in the first insulating layer 16, so as to form the pad units 18. A second insulating layer 22 is provided between each two neighboring semiconductor chips 10. The second insulating layer 22 electrically separates the semiconductor substrate 12 of the upper semiconductor chip 10 from the first metal layer 20 formed on the lower semiconductor chip 10. The second metal layers 24 are provided so as to electrically connect the first metal layers 20 formed on the side faces of the respective semiconductor chips 10.

Figure 3A:
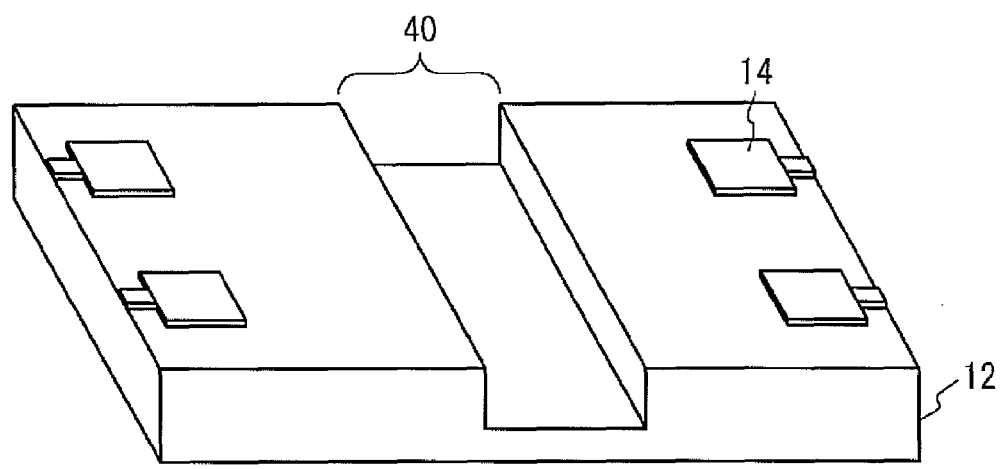
FIGS. 3A and 3B are perspective views showing procedures for manufacturing the semiconductor device in accordance with an embodiment of the present invention.

Referring now to FIGS. 3A through 7B, a method of manufacturing the semiconductor device in accordance with the first embodiment is described. FIGS. 3A through 4B are perspective views of the portion of a semiconductor chip 10 indicated by "B" in FIG. 1, illustrating the procedures for forming the semiconductor chips from semiconductor wafers. Referring first to FIG. 3A, the pad electrodes 14 made of aluminum, for example, are formed on the semiconductor substrate 12 that is a silicon semiconductor wafer. The pad electrodes 14 are electrically connected to a circuit pattern formed on the semiconductor substrate 12. First grooves 40 that contain the scribe lines for dividing the semiconductor substrate 12 into semiconductor chips are formed in the upper face of the semiconductor substrate 12. Each of the first grooves 40 has a depth of 50 μm or greater, for example, and a width of 100 μm or greater, for example. As shown in FIG. 3B, a photosensitive polyimide film 15 is formed to cover the upper face of the semiconductor substrate 12 and the side faces of the first grooves 40 by a spin coat technique, for example. The film thickness of the polyimide film 15 on the semiconductor substrate 12 is about 10 μm, for example.

Figure 4A:
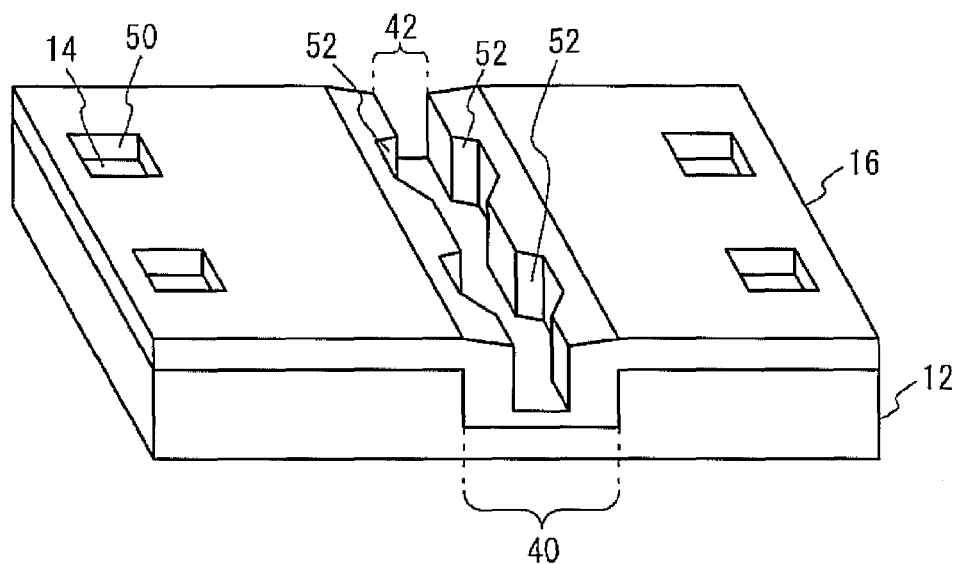
FIGS. 4A and 4B are perspective views also showing procedures for manufacturing the semiconductor device in accordance with an embodiment of the present invention.
Figure 4B:
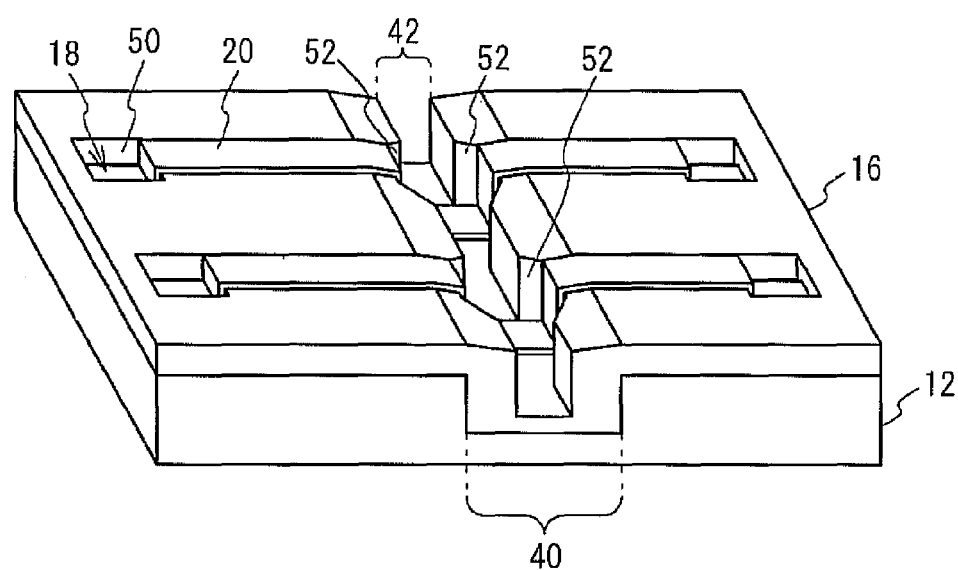

As shown in FIG. 4A, the photosensitive polyimide film 15 is exposed through a predetermined pattern, so as to form second grooves 42 having concavities 52 in the first grooves 40 and the first insulating layer 16 having openings 50 on the pad electrodes 14. The concavities 52 extend from the upper face of the first insulating layer 16 to the bottom faces of the second grooves 42. The depth of each of the second groove 42 is 50 μm or greater, for example, and the width of each second groove 42 is 20 μm or greater, for example. The depth of each of the concavities 52 is 20 μm, for example. As shown in FIG. 4B, the upper face of the first insulating layer 16 and the center of each concavity 52 are plated with copper, for example, so as to form the first metal layers 20.

Figure 5A:
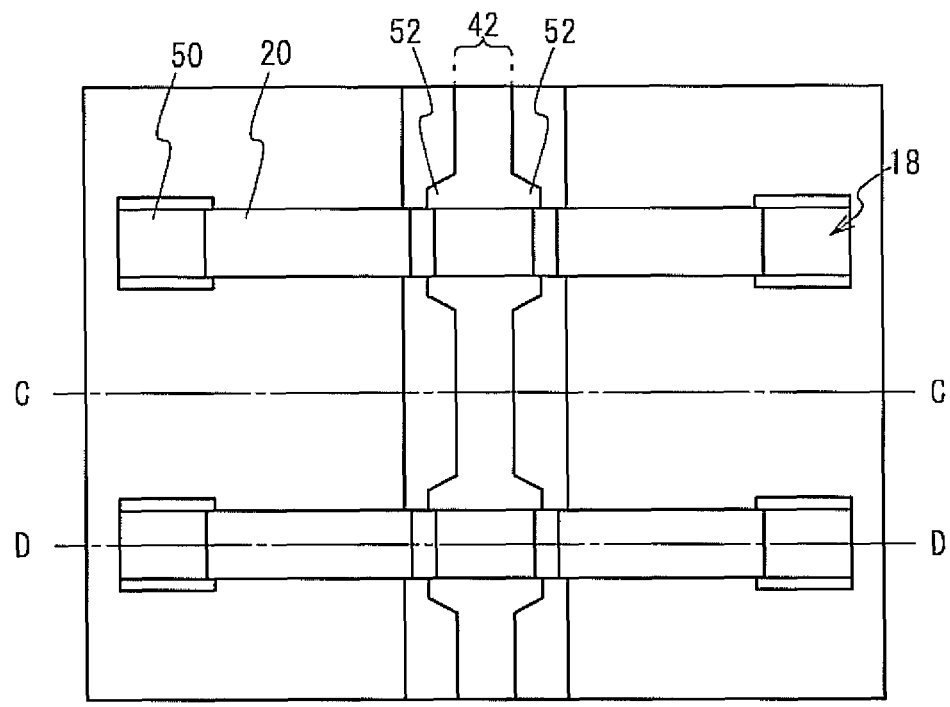
FIG. 5A is a top view of the semiconductor device during a manufacturing process in accordance with an embodiment of the present invention.
Figure 5B:
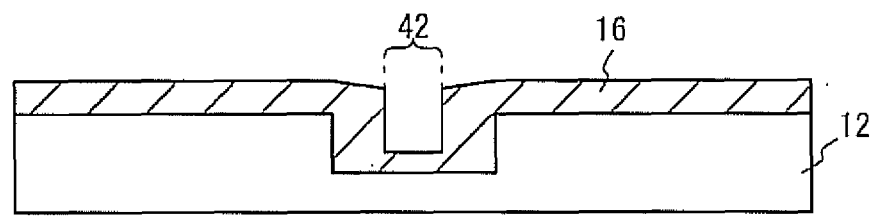
FIG. 5B is a cross-sectional view of the semiconductor device, taken along the line C-C of FIG. 5A, in accordance with an embodiment of the present invention.
Figure 5C:
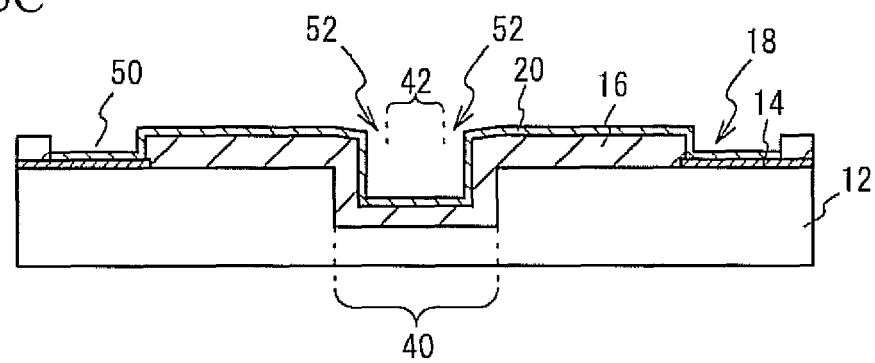
FIG. 5C is a cross-sectional view of the semiconductor device, taken along the line D-D of FIG. 5A, in accordance with an embodiment of the present invention.

FIG. 5A is a top view of the structure in the above situation. FIGS. 5B and 5C are cross-sectional views of the semiconductor chip 10, taken along the lines C-C and D-D of FIG. 5A, respectively. As shown in FIGS. 5A through 5C, the concavities 52 are formed in the second grooves 42 formed in the first insulating layer 16. The first metal layers 20 are formed in the centers of the respective concavities 52. The first metal layers 20 are connected to the pad electrodes 14 formed on the semiconductor substrate 12 through the openings 50.

Figure 6:
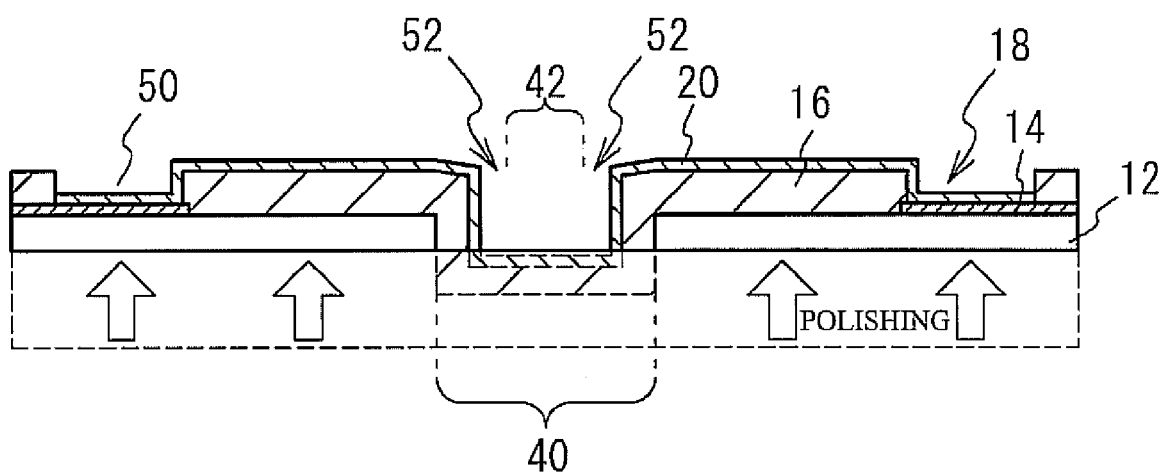
FIG. 6 is a cross-sectional view showing another procedure for manufacturing the semiconductor device in accordance with an embodiment of the present invention.

FIG. 6 is a cross-sectional view of the structure, taken along the line D-D of FIG. 5A. As shown in FIG. 6, polishing is performed on the bottom face of the semiconductor substrate 12 until it reaches the semiconductor grooves 42. At this point, the thickness of the semiconductor substrate 12 is about 50 μm, for example. Since the depth of each of the second grooves 42 is 50 μm or greater, for example, the semiconductor substrate 12 is divided by the second grooves 42, so as to produce semiconductor chips 10. The procedure for thinning the semiconductor substrate 12 may be carried out using a technique other than polishing.

Figure 7A:
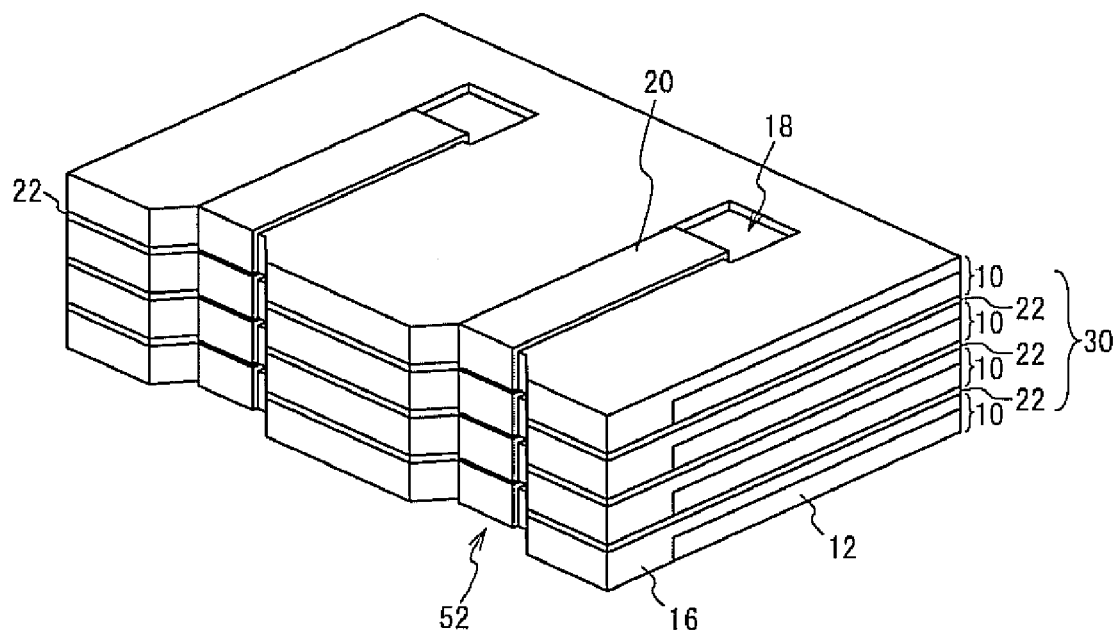
FIGS. 7A and 7B are perspective views also showing procedures for manufacturing the semiconductor device in accordance with an embodiment of the present invention.
Figure 7B:
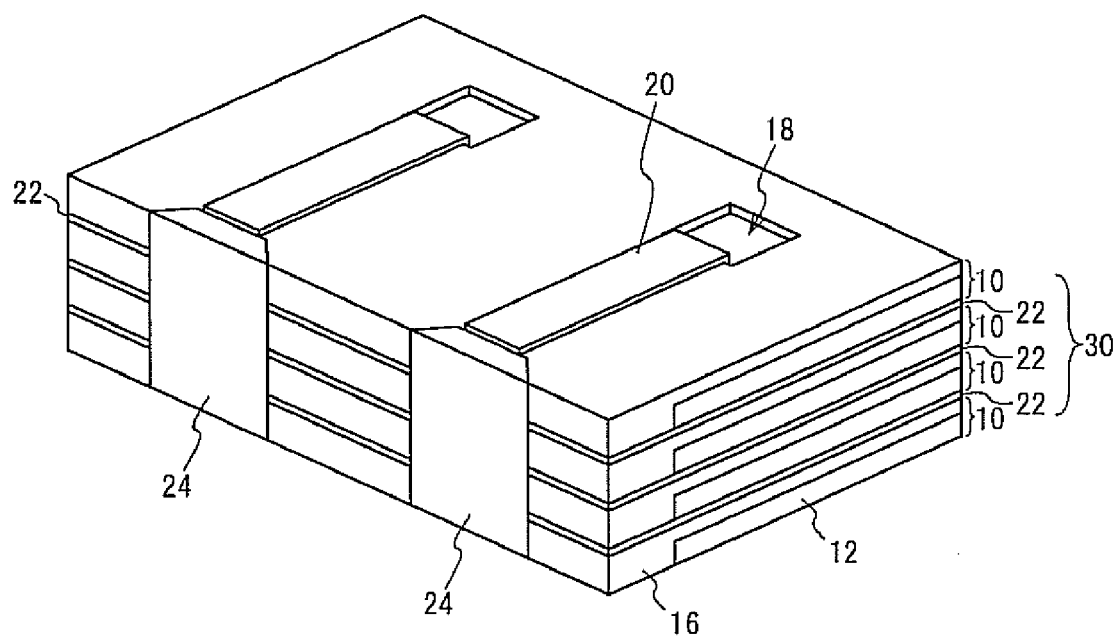

FIGS. 7A and 7B are perspective views of the portion B of FIG. 1. As shown in FIG. 7A, the semiconductor chips 10 divided in the manner shown in FIG. 6 are stacked. A second insulating layer 22 is interposed between each two semiconductor chips 10, so that the semiconductor chips 10 are bonded to one another with an adhesive agent. At this point, the concavities 52 in each of the semiconductor chips 10 form the concavity portions 52 extending from the upper face of the uppermost one of the stacked semiconductor chips 10 to the lower face of the lowermost one. The second insulating layers 22 may be formed on the first metal layers 20 before the polishing is performed on the bottom face in FIG. 6.

As shown in FIG. 7B, the concavity portions 52 of the semiconductor chips 10 are squeegeed and filled with silver paste, for example, so as to form the second metal layers 24. With the second metal layers 24, the first metal layers 20 formed in the respective semiconductor chips 10 are electrically connected. Thus, the semiconductor device in accordance with the first embodiment is completed.

In the first embodiment, the stacked semiconductor chips 10 are not necessarily identical semiconductor chips. For example, it is possible to stack semiconductor chips having semiconductor memory devices formed thereon, on semiconductor chips having logic circuits formed thereon. Also, not all the stacked semiconductor chips 10 necessarily have the pad electrodes 14 connected to all the second metal layers 24 formed in the concavity portions 52. Meanwhile, more than one pad electrode 14 may be connected to one second metal layer 24 in one semiconductor chip 10. It is possible to determine which pad electrode(s) 14 of each semiconductor chip 10 is (are) to be connected to the corresponding one(s) of the concavity portions 52, in accordance with which function is to be realized in a stacked semiconductor chips 30. In the first embodiment, each semiconductor chip 10 includes the first insulating layer 16 having the concavities 52, and the first metal layers 20. However, at least one of the stacked semiconductor chips should include the first insulating layer 16 having the concavities 52 formed therein, and the first metal layers 20.

Figure 8:
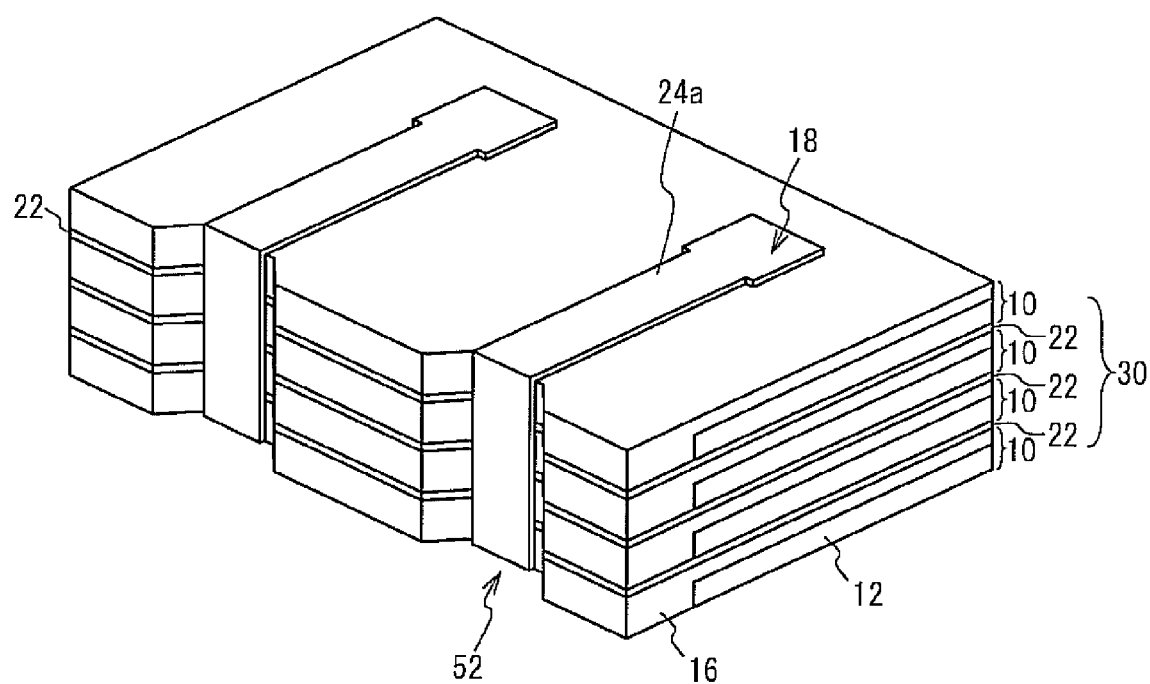
FIG. 8 is a perspective view of a semiconductor device in accordance with an embodiment of the present invention.

As shown in FIG. 8, second metal layers 24a made of copper may be formed by an electroless plating technique, for example. In a case where the second metal layers are formed by an electroless plating technique, the plating layers formed on the first metal layers 20 each have a reasonable thickness. Accordingly, the plating layers formed on the first metal layers 20 of the semiconductor chips 10 having spaces in between are connected to one another over the first metal layers 20. If the first metal layers 20 of the respective semiconductor chips 10 having spaces in between are not electrically connected, an electroless plating technique is utilized to form the second metal layers 24, so as to connect the first metal layers 20 to one another.

In the semiconductor device in accordance with the first embodiment, each semiconductor chip 10 has the first insulating layer 16 formed on the side faces of the semiconductor substrate 12. The first insulating layer 16 has the concavities 52 formed at regular intervals between the top face and the lower face of the semiconductor chip 10. The first metal layers 20 are formed in the centers of the inner side faces of the concavities 52. In the semiconductor device formed with stacked semiconductor chips 10, the second metal layers 24 that electrically connect the first metal layers 20 formed on the respective semiconductor chips 10 are formed in the concavities 52 of each semiconductor chip 10.

The first metal layers 20 and the second metal layers 24 formed on each semiconductor chip 10 are connected, so as to connect the semiconductor chips 10 to one another via the second metal layers 24. In a case where the concavities 52 are formed in the semiconductor substrate 12 as in the first conventional example, it is necessary to perform etching on the semiconductor substrate 12. In the first embodiment, on the other hand, the first insulating layer 16 is formed on the side faces of the semiconductor substrate 12, and the first insulating layer 16 has the concavities 52. Accordingly, the concavities 52 can be easily formed. The first metal layers 20 are formed in the centers of the inner side faces of the concavities 52. More specifically, each first metal layer 20 formed on the inner side faces of the concavities 52 extends from the first metal layer 20 formed on the upper face of the first insulating layer 16. Any first metal layer 20 is not formed in the regions in contact with the second grooves 42. With the first metal layers 20 being formed in this manner, it is possible to avoid the problem that is observed with the first and second conventional examples that the first metal layers 20 come off when through holes are formed. Further, it is possible to squeegee the concavities 52 with silver paste, so as to readily form the second metal layers 24, as shown in FIG. 7B. As at least one semiconductor chip 10 among the stacked semiconductor chips 30 includes the first insulating layer 16 having the concavities 52 and the first metal layers 20, the above described effects can be achieved with the semiconductor chip 10.

The first insulating layer 16 is provided on the upper face and the side faces of the semiconductor substrate 12. Accordingly, the first insulating layer 16 can be easily formed through the application of the polyimide film 16 and an exposing and developing process.

Further, the second insulating layer 22 is provided on the first metal layers 20 formed on the upper face of the first insulating layer 16. With this arrangement, the first metal layers 20 can be prevented from coming into contact with the semiconductor chip 10 located above the subject semiconductor chip 10. The second insulating layer 22 formed on the first metal layers 20 serves to prevent short-circuiting with the semiconductor chip 10 located above. However, if there is unevenness in the upper face of the subject semiconductor chip 10, the thermal resistance between the semiconductor chips 10 becomes higher. Therefore, the second insulating layer 22 should preferably cover the entire upper face of each semiconductor chip 10.

Further, each semiconductor chip 10 has the pad electrodes 14 formed on the upper face of the semiconductor substrate 12. The first insulating layer 16 has the openings 50 on the respective pad electrodes 14. The first metal layers 20 are also formed on the upper face of the first insulating layer 16, and are connected to the pad electrodes 14 through the openings 50. With this arrangement, the pad electrodes 14 of different semiconductor chips 10 can be connected to one another via the second metal layers 24.

By the method of manufacturing the semiconductor device in accordance with the first embodiment, the first grooves 40 are formed in the upper face of the semiconductor substrate 12 that is a semiconductor wafer, as shown in FIG. 3A. As shown in FIG. 4A, the first insulating layer 16 that covers the upper face of the semiconductor substrate 12 and the side faces of the first grooves 40 is formed. The first insulating layer 16 also has the second grooves 42 inside the first grooves 40, and the second grooves 42 have the concavities 52 formed on the side faces thereof. As shown in FIG. 4B, the first metal layer 20 covers the inner side faces of the concavities 52. As shown in FIG. 6, polishing is performed on the bottom face of the semiconductor substrate 12 until it reaches the bottom faces of the second grooves 42, so as to divide the semiconductor substrate 12 into semiconductor chips 10. By this manufacturing method, there is no need to form through holes. Accordingly, there is no need to perform etching for forming the through holes, and the production costs can be reduced. As the polishing is performed on the lower face of the semiconductor substrate 12, there is no need to cut the metal layers by a dicing technique to obtain individual semiconductor chips 10. Thus, the first metal layers 20 can be prevented from coming off.

Figure 3B:
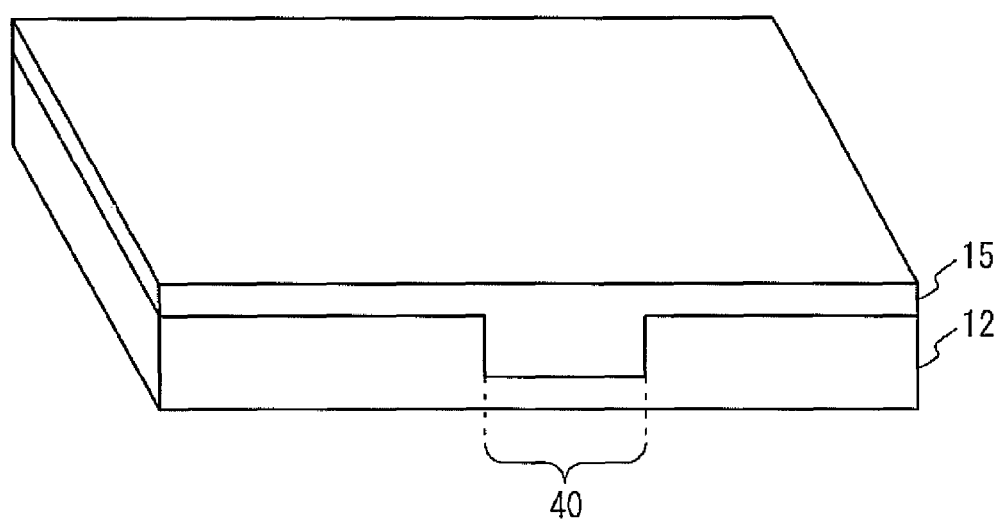

Also, to form the first insulating layer 16, the polyimide film 15 (an insulating film) is formed on the upper face of the semiconductor substrate 12 and the side faces of the first grooves 40, as shown in FIG. 3B. The second grooves 42 having the concavities 52 are then formed in the polyimide film 15, as shown in FIG. 4A. Through this procedure, the second grooves 42 and the concavities 52 can be easily formed, without the formation of through holes. The insulating film to be the first insulating film is an insulating film other than the polyimide film 15. In the first embodiment, a predetermined region of the photosensitive polyimide film 15 is exposed to light, so as to form the second grooves 42 and the concavities 52. However, the second grooves 42 and the concavities 52 may be formed by forming a photoresist on the insulating film to be the first insulating film and then performing etching.

Further, as shown in FIG. 4A, the first insulating layer 16 is formed so as to have the openings 50 on the pad electrodes 14 formed on the semiconductor substrate 12. As shown in FIG. 4B, the first metal layers 20 are formed on the upper face of the first insulating layer 16, so that the first metal layers 20 are connected to the pad electrodes 14 through the openings 50. Through these procedures, the circuits formed on the semiconductor chip 10 can be electrically connected to the second metal layers 24 via the first metal layers 20.

Further, as shown in FIG. 4B, the first metal layers 20 are formed in the centers of the inner side faces of the concavities 52. Although the first metal layers 20 may be formed on the entire concavities 52, the formation of the first metal layers 20 in the centers of the inner side faces of the concavities 52 is advantageous in that the silver paste is stuck on the first metal layers 20 at the time of the squeegee in the first embodiment, so as to prevent the first metal layers from coming off, as shown in FIG. 7B. Also, as shown in FIG. 8, the second metal layers 24 formed by an electroless plating technique can prevent short-circuiting between the plating layer grown from the first metal layers 20 and the first metal layers 20 in the concavities 52.

Further, as shown in FIG. 7A, more than one semiconductor chips 10 are stacked on one another. As shown in FIG. 7B, the second metal layers 24 are formed in the concavities 52 and are connected to the respective first metal layers 20 of the semiconductor chips 10. In this manner, the second metal layers 24 to be connected to the first metal layers 20 can be easily formed, as the concavities 52 are filled with the silver paste used for the squeegee.

Second Embodiment

Figure 9A:
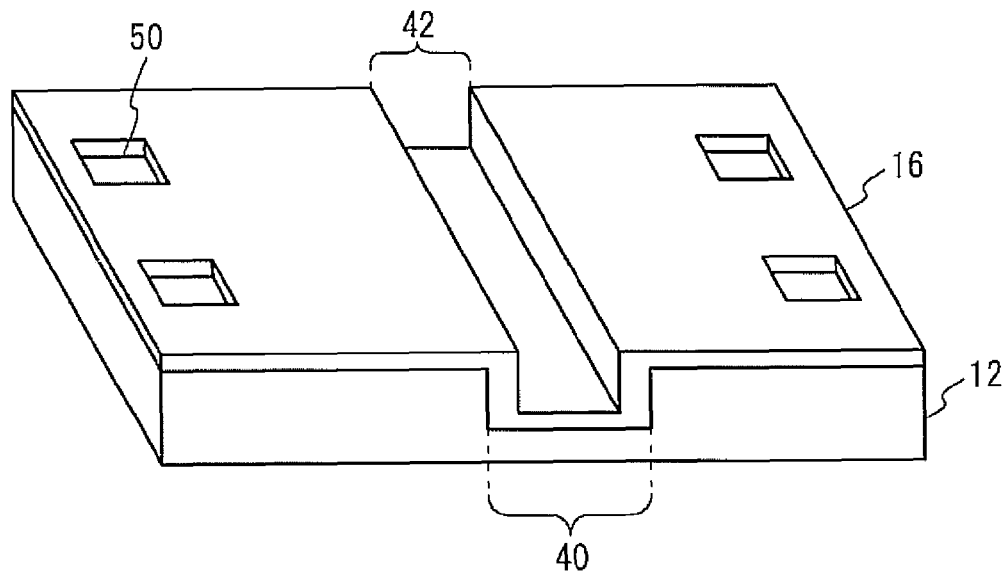
FIGS. 9A and 9B are perspective views showing procedures for a semiconductor device in accordance with an embodiment of the present invention.
Figure 9B:
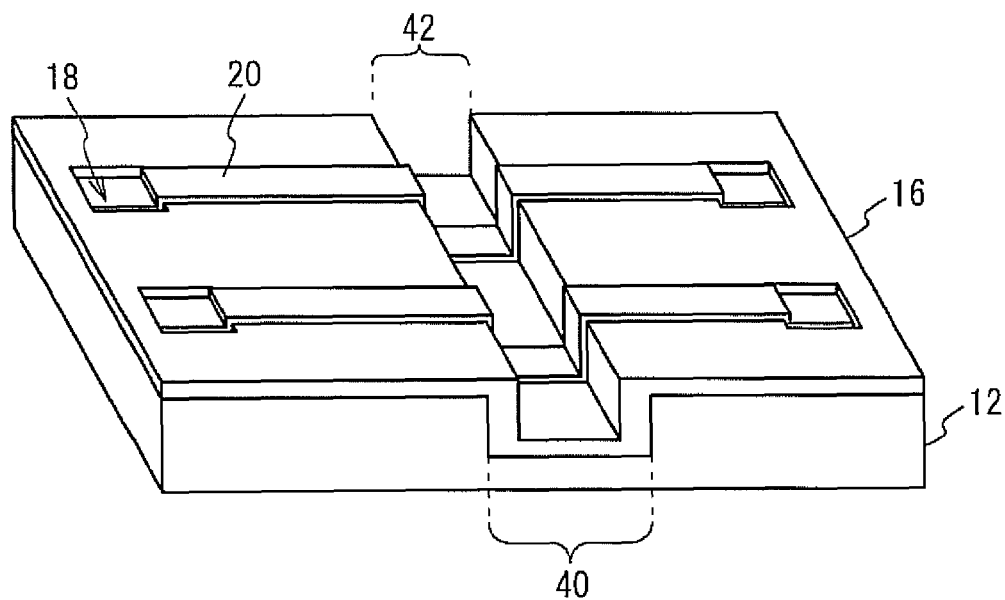

A second embodiment is an example of a semiconductor device that has a second insulating layer formed on the first metal layers 20 and the side faces of the first insulating layer, and also has concavities on its side faces. Referring to FIGS. 9A through 12, a method of manufacturing the semiconductor device in accordance with the second embodiment is described. Like FIG. 3A, FIGS. 9A through 10B are perspective views of the portion B of the semiconductor device. As shown in FIG. 9A, the procedures of the first embodiment illustrated in FIGS. 3A and 3B are carried out. More specifically, the second grooves 42 are formed in the first grooves 40, and the first insulating layer 16 having the openings 50 on the pad electrodes 14 is formed. The width of each of the first grooves 40 is about 100 μm, and the width of each of the second grooves 42 is about 40 μm, for example. The depths of each first groove 40 and each second groove 42 are both 50 μm or greater, for example. The film thickness of the first insulating layer 16 is about 10 μm, for example. As shown in FIG. 9B, the first metal layers 20 are formed on the upper face and the side faces of the first insulating layer 16. The first metal layers 20 are connected to the pad electrodes 14 through the openings 50, so as to form the pad units 18.

Figure 10A:
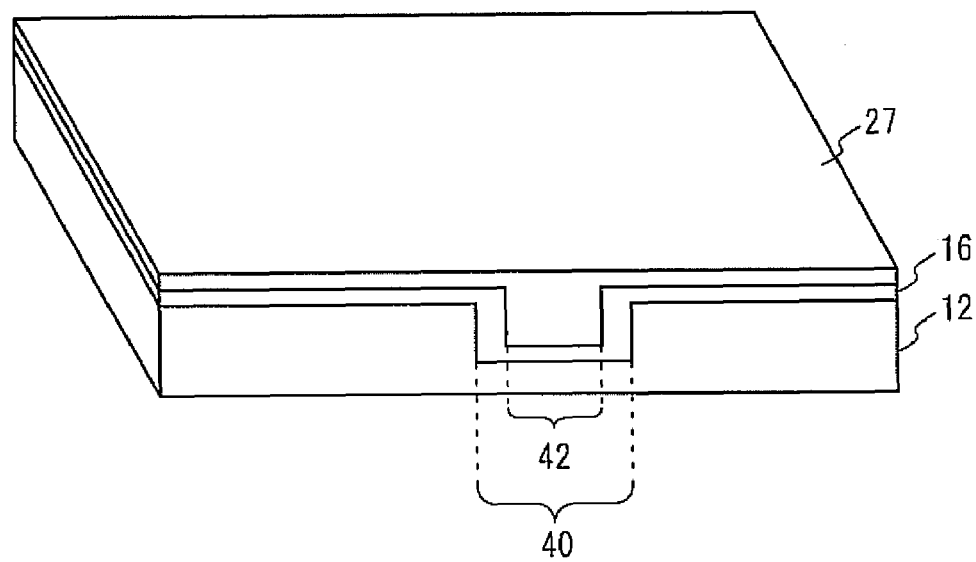
FIGS. 10A and 10B are perspective views also showing procedures for manufacturing the semiconductor device in accordance with an embodiment of the present invention.
Figure 10B:
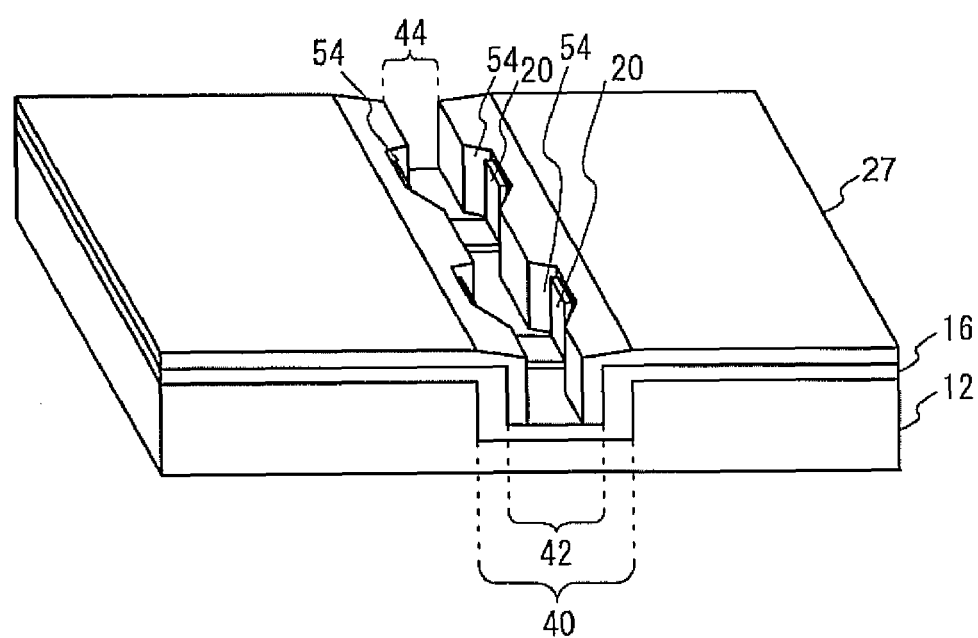

As shown in FIG. 10A, a photosensitive polyimide film 27 of 10 about μm, for example, is applied to the second grooves 42 in such a manner as to cover the upper face of the first insulating layer 16 and the side faces of the second grooves 42. As shown in FIG. 10B, a predetermined region of the polyimide film 27 is exposed and developed. In this manner, third grooves 44 having concavities 54 formed on the inner side faces of the second grooves 42 are formed. The depth of each of the third grooves 44 is 50 μm or greater, for example, and the width of each of the third grooves 44 is about 20 μm, for example. The depth of each of the concavities 54 is about 20 μm, for example.

Figure 11A:
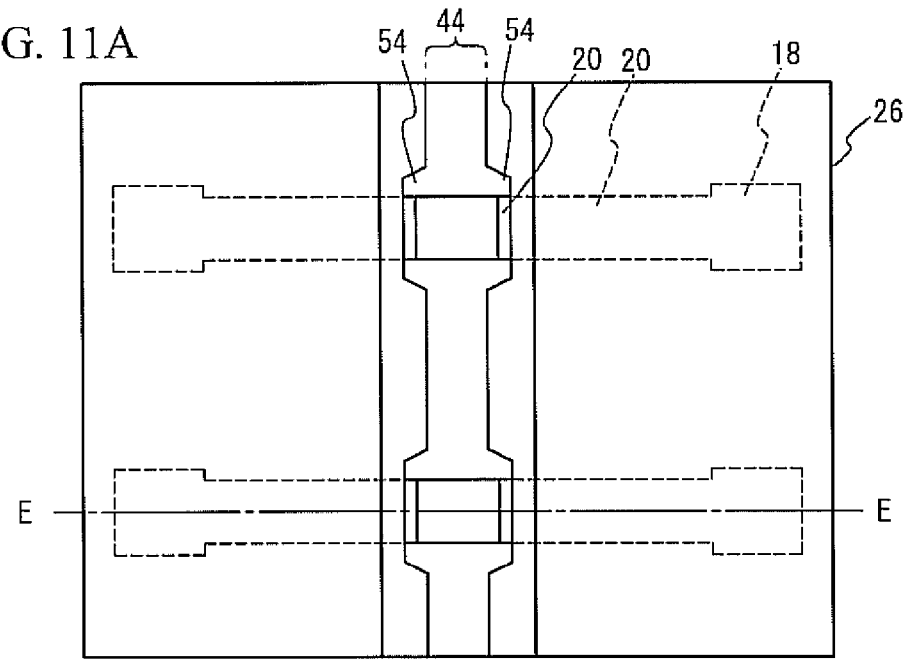
FIG. 11A is a top view of the semiconductor device during a manufacturing process in accordance with an embodiment of the present invention.
Figure 11B:
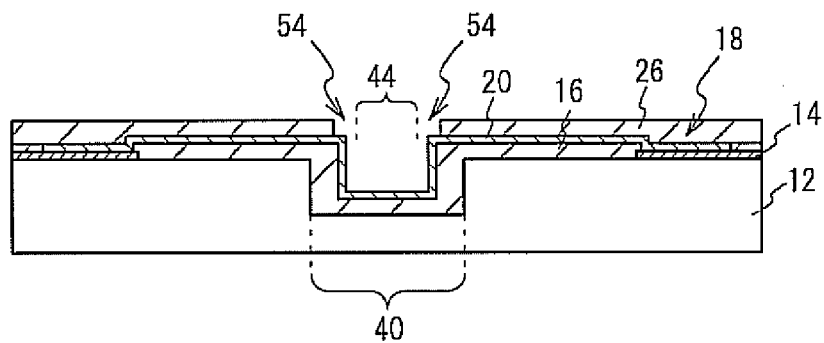
FIG. 11B is a cross-sectional view of the semiconductor device, taken along the lien E-E of FIG. 11A, in accordance with an embodiment of the present invention.

FIG. 11A is a top view of this structure. FIG. 11B is a cross-sectional view of the structure, taken along the line E-E of FIG. 11A. As shown in FIGS. 11A and 11B, the concavities 54 are formed in such a manner that the first metal layers 20 formed on the upper face and the side faces of the first insulating film 16 are exposed through the centers of the inner side faces of the concavities 54. Since the total width of each third groove 44 (20 μm, for example) and the depth of the concavities on both sides (2×20 μm, for example) is greater than the width of each second groove 42 (40 μm, for example), the first metal layers 20 can be exposed through the inner side faces of the concavities 54.

Figure 12:
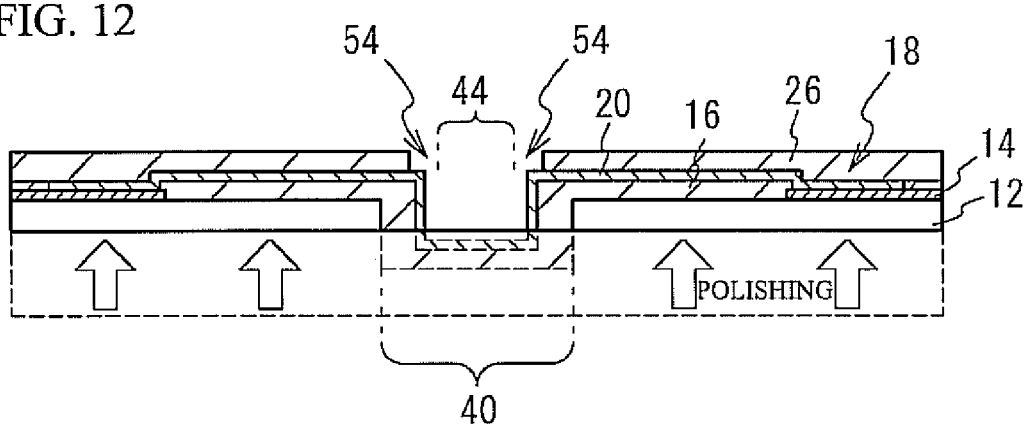
FIG. 12 is a cross-sectional view showing a procedure for manufacturing the semiconductor device in accordance with an embodiment of the present invention.

FIG. 12 is a cross-sectional view of the structure, taken along the line E-E of FIG. 11A. As shown in FIG. 12, polishing is performed on the bottom face of the semiconductor substrate 12 until it reaches the third grooves 44. At this point, the thickness of the semiconductor substrate 12 is 50 μm, for example. Since the dept of each of the third grooves 44 is 50 μm or greater, for example, the semiconductor substrate 12 is divided by the third grooves 44 into the semiconductor chips 10. The same manufacturing procedures as those of the first embodiment illustrated in FIGS. 7A and 7B are then carried out to complete the semiconductor device in accordance with the second embodiment.

Unlike the structure of the first embodiment, the structure of the second embodiment includes a second insulating layer 26 that is formed on the upper faces of the first metal layers 20 and the side faces of the first insulating layer 16, and has the concavities 54 on its side faces. Further, the second metal layers 24 are connected to the first metal layers 20 formed on each semiconductor chip 10 through the concavities 52. By virtue of the second insulating layer 26, electric contact between the semiconductor substrate 12 of the semiconductor chip 10 stacked on the subject semiconductor chip 10 and the first metal layers 20 can be prevented. Also, since the second insulating layer 26 is provided on the side faces of the first insulating layer 16, the second insulating layer 26 is prevented from not covering the first metal layers 20 when the positioning accuracy in the formation of the second insulating layer 26 is poor. As in the first embodiment, at least one of the stacked semiconductor chips should include the first insulating layer 16 having the concavities 52, the first metal layer 20, and the second insulating layer 26.

By the method of manufacturing the semiconductor device in accordance with the second embodiment, the first grooves 40 are formed on the upper face of the semiconductor substrate 12 that is a semiconductor wafer, as shown in FIG. 9A. The first insulating layer 16 having second grooves 42 formed therein is formed in the first grooves 40, so as to cover the upper face of the semiconductor substrate 12 and the side faces of the first grooves 40. As shown in FIG. 9B, the first metal layers 20 are formed on the upper face of the first insulating layer 16. As shown in FIG. 10B, the third grooves 44 having the concavities 54 formed on the inner side faces of the second grooves 42 are provided to cover the upper face of the first insulating layer 16 and the side faces of the second grooves 42. The second insulating layer 26 is formed in such a manner as to expose the first metal layers 20 through the inner side faces of the concavities 54. As shown in FIG. 12, polishing is performed on the bottom face of the semiconductor substrate 12 until it reaches the bottom faces of the third grooves 44, so as to divide the semiconductor substrate 12 into semiconductor chips 10. In the first embodiment, misalignment might be caused between the second insulating layer 22 and the first metal layers 20. For example, if the second insulating layer 22 does not properly cover the first metal layers 20, short-circuiting is caused between the first metal layers 20 and the semiconductor substrate 12 of the semiconductor chip 10 stacked on the subject semiconductor chip 10. Meanwhile, if a second insulating layer is formed in the concavities 54 of the first insulating layer 16, it is difficult to form the second metal layers 24. In addition to the same effects as those of the first embodiment, the manufacturing method in accordance with the second embodiment can achieve the effect that short-circuiting between the first metal layers 20 and the semiconductor substrate 12 above the first metal layers 20 due to misalignment can be prevented, since the second insulating layer 26 can cover the first metal layers 20 except for the first metal layers 20 exposed through the concavities 54.

Further, as shown in FIG. 10A, to form the second insulating layer 26, the polyimide film 27 (an insulating film) is formed on the first metal layers 20 and the first insulating layer 16. As shown in FIG. 10B, the third grooves 44 having the concavities 54 are formed in the polyimide film 27. Through these procedures, the second grooves 44 and the concavities 54 can be easily formed. The insulating film to be the second insulating film may be an insulating film other than the polyimide film 27. Also, the third grooves 44 and the concavities 54 may be formed by forming a photoresist on the insulating film to be the second insulating film and then performing etching.

Third Embodiment

Figure 13:
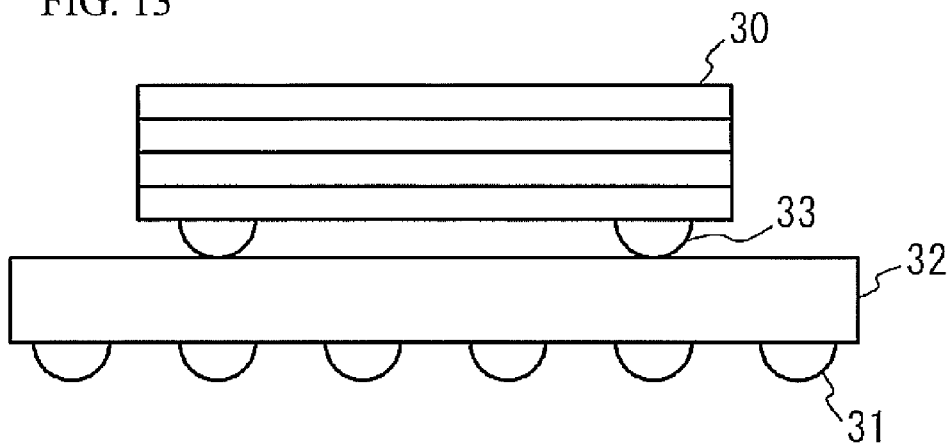
FIG. 13 is a cross-sectional view of a semiconductor device in accordance with an embodiment of the present invention.

Third through fifth embodiments are examples of semiconductor devices each having stacked semiconductor chips (built-in semiconductor devices) mounted in packages. As shown in FIG. 13, the package has a printed board 32 made of glass epoxy resin, and the stacked semiconductor chips 30 of the first or the second embodiment are flip-chip mounted on the printed board 32 with solder balls 33. The solder balls 33 are provided on the pad units 18 of the uppermost semiconductor chip 10 of the first embodiment shown in FIG. 1, for example. Solder balls 31 are provided on the opposite face from the semiconductor chips 30 stacked on the printed board 32. The solder balls 31 and the solder balls 33 are connected with connecting portions (not shown) of the printed board 32.

Fourth Embodiment

Figure 14:
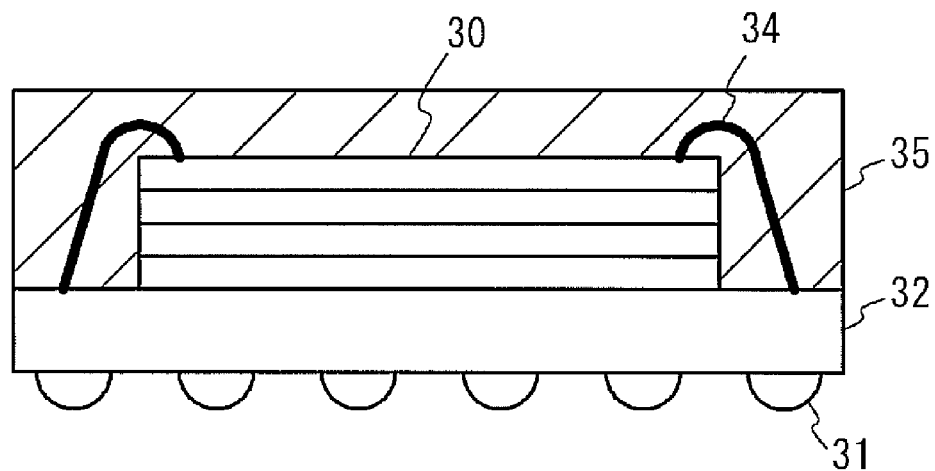
FIG. 14 is a cross-sectional view of a semiconductor device in accordance with an embodiment of the present invention.

As shown in FIG. 14, the package includes a printed board 32 and epoxy resin 35, and stacked semiconductor chips (built-in semiconductor devices) are face-up mounted on the printed board 32. The printed board 32 and the semiconductor chips 30 are connected with wires 34. The wires 34 are connected to the pad units 18 of the uppermost semiconductor chip 10 of the first embodiment shown in FIG. 1, for example. The stacked semiconductor chips 30 are sealed with the epoxy resin 35. In the third and fourth embodiments, the stacked semiconductor chips are mounted on the printed board 32. However, the stacked semiconductor chips may be mounted on a substrate having conductive wires formed on an insulating substrate.

Fifth Embodiment

Figure 15:
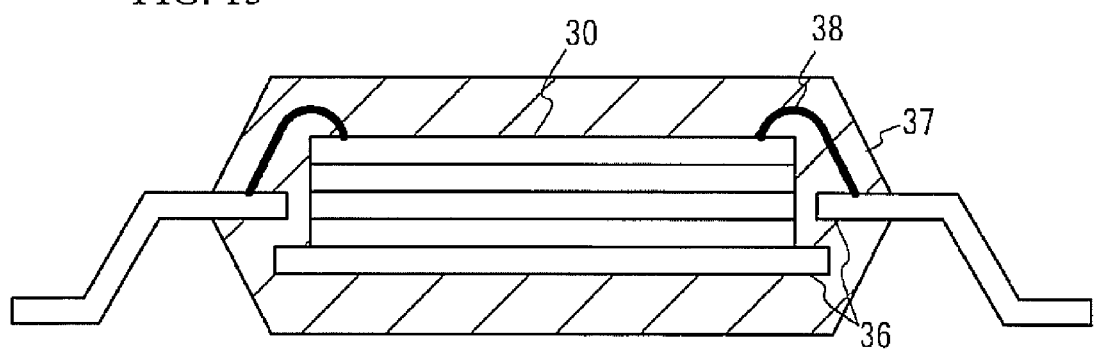
FIG. 15 is a cross-sectional view of a semiconductor device in accordance with an embodiment of the present invention.

As shown in FIG. 15, the package includes a lead frame 36 and epoxy resin 37, and stacked semiconductor chips 30 (built-in semiconductor devices) are mounted on the lead frame 36. The lead frame 36 and the stacked semiconductor chips 30 are connected with wires 38. The stacked semiconductor chips 30 are resin-sealed with the epoxy resin 37, for example. As in the third through fifth embodiments, the stacked semiconductor chips 30 (built-in semiconductor devices) of the first or second embodiment may form a semiconductor device mounted in a package.

In the first and second embodiments, the first insulating layer 16 and the second insulating layer 26 are insulating films made of polyimide. However, those insulating layers are not necessarily polyimide films. For example, it is possible to employ an inorganic film such as silicon oxide film, or an organic film. The first metal layers 20 are made of copper and formed by a plating method. However, other metal layers can be employed for the first metal layers 20. For example, it is possible to employ aluminum or gold. The second metal layers 24 are metal layers formed with silver paste by an electroless plating technique. However, other metal layers may be employed for the second metal layers 24. For example, it is possible to employ gold or copper.

Embodiments generally relates to semiconductor devices. More particularly, embodiments allow lower-cost semiconductor devices. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells", each of which traditionally stores one bit of information. However, newer flash memory devices, such as MirrorBit® Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit® technology has several key advantages. For example, flash memory that utilizes MirrorBit® technology is capable of burst-mode access as fast as 80 MHz, page access times as fast as 25 ns, simultaneous read-write operation for combined code and data storage, and low standby power (e.g., 1 μA).

Figure 16:
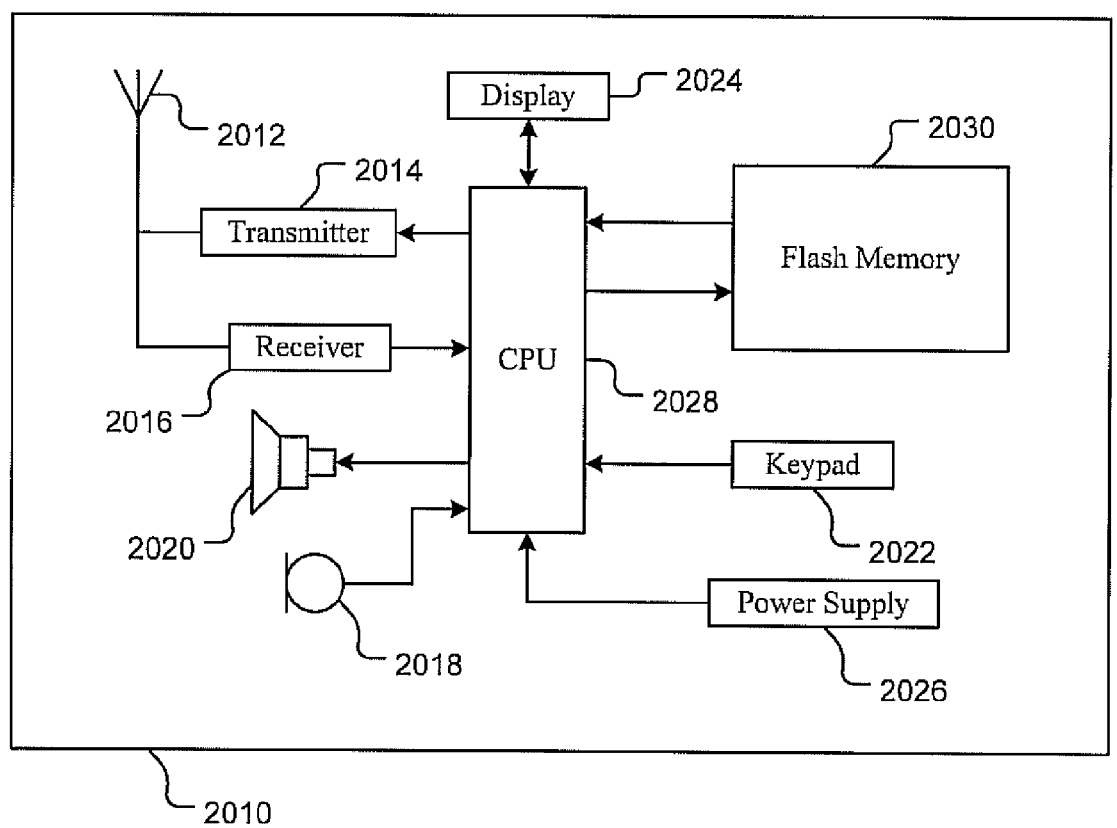
FIG. 16 illustrates a block diagram of a conventional portable phone, upon which embodiments may be implemented.

FIG. 16 shows a block diagram of a conventional portable telephone 2010 (e.g., cell phone, cellular phone, mobile phone, internet protocol phone, wireless phone, etc.), upon which embodiments can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips. According to various embodiments, it is possible to provide a semiconductor device, such as flash memory, that has metal layers that are formed on the side faces of stacked semiconductor chips, and electrically connect the semiconductor chips. The present invention also provides a method of manufacturing such a semiconductor device. As a result, the flash memory 2030 is able to be manufactured at a much lower cost than previous. This decreased cost for the flash memory translates into lower costs for various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a less expensive flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 17:
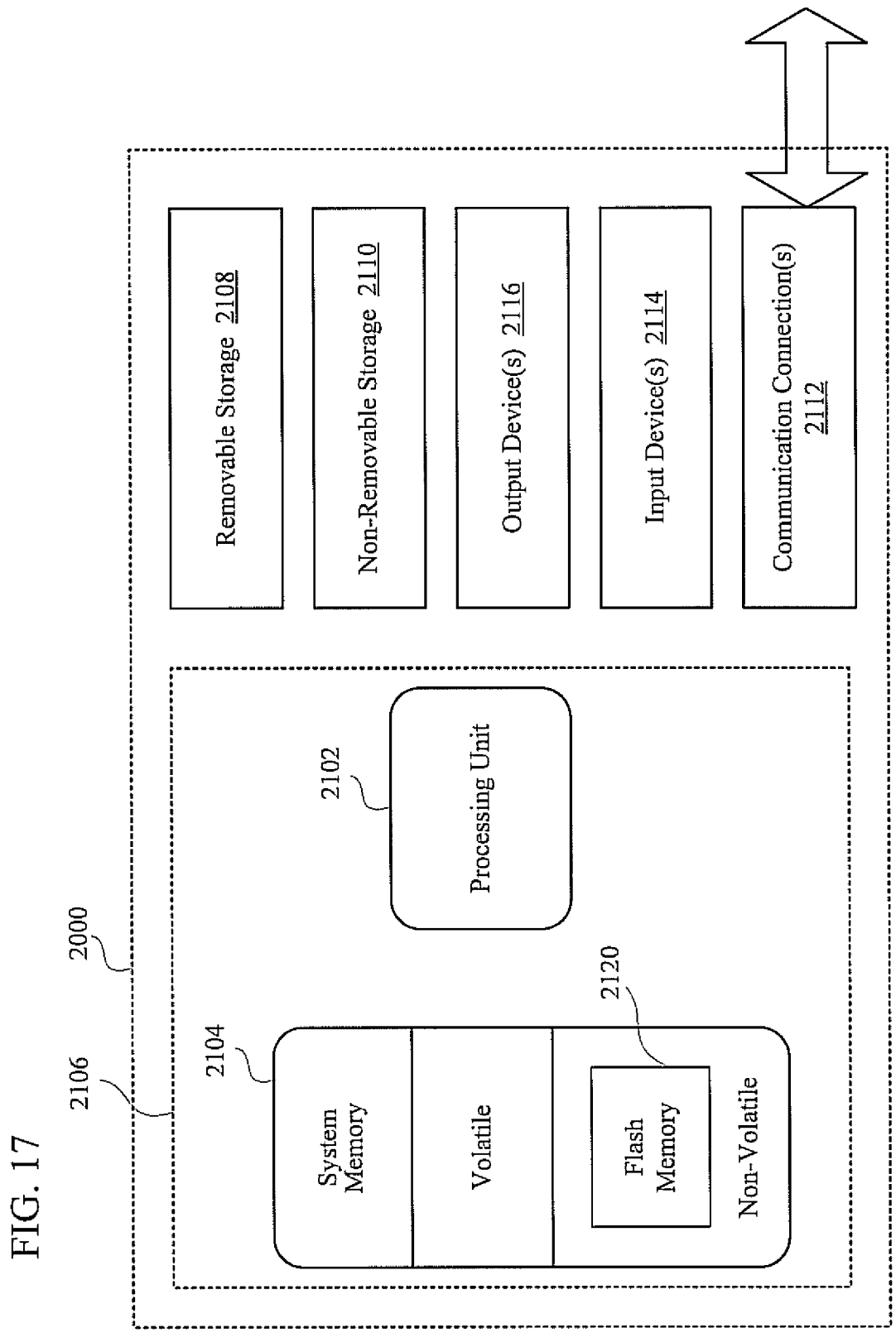
FIG. 17 illustrates a block diagram of a computing device, upon which embodiments may be implemented.

FIG. 17 illustrates a block diagram of a computing device 2100, upon which embodiments of the present claimed subject matter can be implemented. Although computing device 2100 is shown and described in FIG. 17 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 17.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 17 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 17 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips. According to various embodiments, it is possible to provide a semiconductor device, such as flash memory, that has metal layers that are formed on the side faces of stacked semiconductor chips, and electrically connect the semiconductor chips. The present invention also provides a method of manufacturing such a semiconductor device. As a result, the flash memory 2030 is able to be manufactured at a much lower cost than previous. This decreased cost for the flash memory translates into lower costs for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes MirrorBit® technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Users would also benefit from reduced memory read time and reduced cost.

Figure 18:
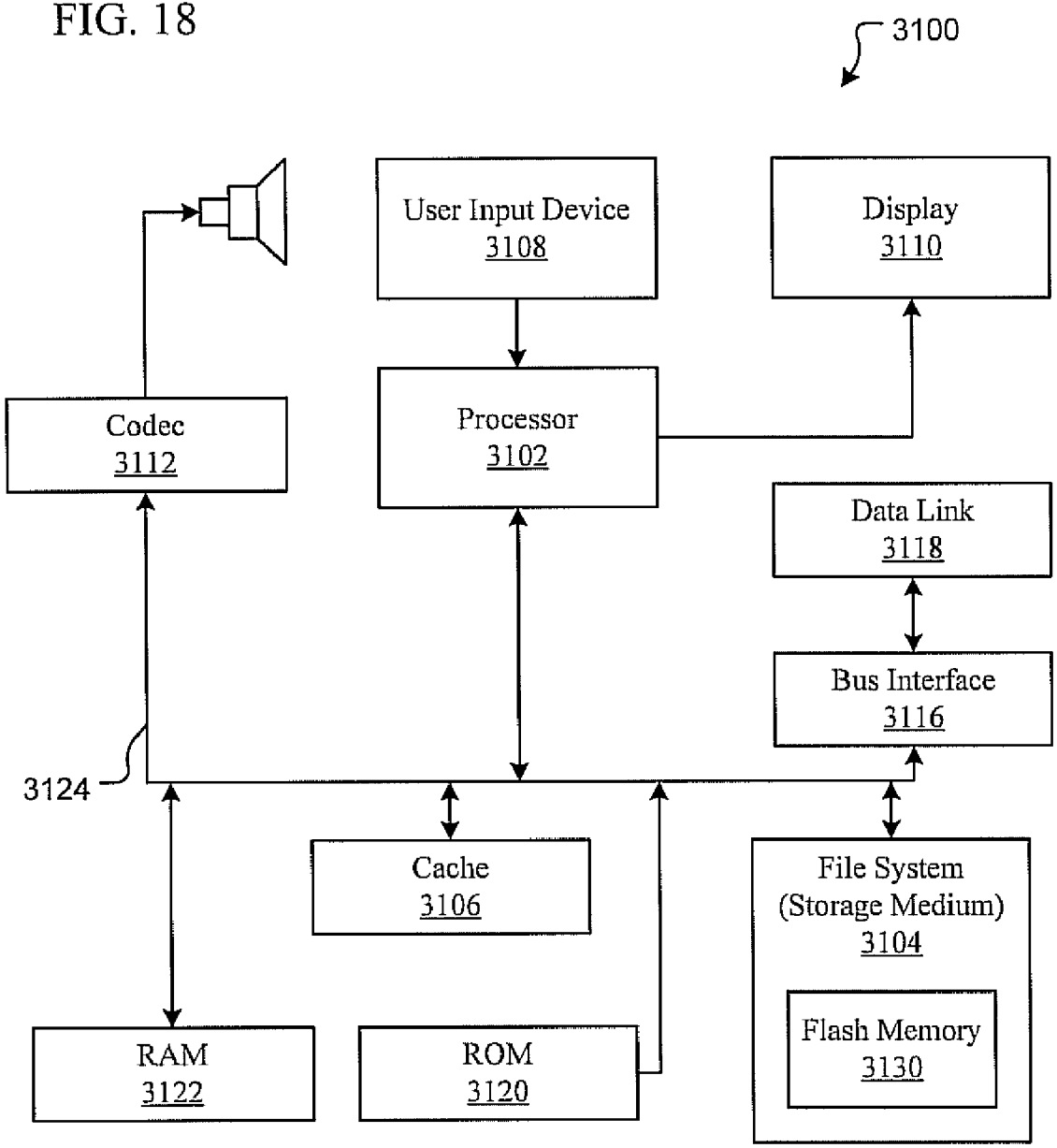
FIG. 18 illustrates an exemplary portable multimedia device, or media player, in accordance with various embodiments of the present invention.

FIG. 18 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, the flash memory 3130 comprises: a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips. According to various embodiments, it is possible to provide a semiconductor device, such as flash memory, that has metal layers that are formed on the side faces of stacked semiconductor chips, and electrically connect the semiconductor chips. The present invention also provides a method of manufacturing such a semiconductor device. As a result, the flash memory 2030 is able to be manufactured at a much lower cost than previous. This decreased cost for the flash memory translates into lower costs for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that connect to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Finally, various aspects of the present invention are summarized in the following.

According to a first aspect of the present invention, there is provided a semiconductor device including: a plurality of stacked semiconductor chips, at least one of the semiconductor chips including a semiconductor substrate, a first insulating layer that is provided on side faces of the semiconductor substrate and has concavities formed on side faces thereof, and first metal layers that are provided in center portions of inner side faces of the concavities; and second metal layers that are provided in the concavities and are connected to the first metal layers formed on the at least one of the semiconductor chips.

In the above-described semiconductor device, the first insulating layer may be provided on an upper face of the semiconductor substrate. The first insulating layer can be easily formed.

In the above-described semiconductor device, the first metal layers may be provided on an upper face of the first insulating layer; and the semiconductor device may further include a second insulating layer that is formed on upper faces of the first metal layers. Electric contact between the upper semiconductor chip of the stacked semiconductor chips and the first metal layers can be prevented.

According to a second aspect of the present invention, there is provided a semiconductor device including: a plurality of stacked semiconductor chips, at least one of the semiconductor chips including a semiconductor substrate, a first insulating layer that is provided on side faces and an upper face of the semiconductor substrate, first metal layers that are provided on side faces and an upper face of the first insulating layer, and a second insulating layer that is provided on upper faces of the first metal layers and side faces of the first insulating layer and has concavities on side faces thereof; and second metal layers that are provided in the concavities and are connected to the first metal layers formed on the at least one of the semiconductor chips, the second metal layers being connected to the first metal layers through the concavities.

In the above-described semiconductor device, the at least one of the semiconductor chips may include pad electrodes that are provided on the semiconductor substrate; the first insulating layer may have openings that are formed over the pad electrodes; and the first metal layers may be also provided on an upper face of the first insulating layer, and are connected to the pad electrodes through the openings. The pad electrodes of different semiconductor chips can be connected via the second metal layers.

According to a third aspect of the present invention, there is provided a semiconductor device including a package that has a built-in semiconductor device mounted therein, the built-in semiconductor device being the above-described semiconductor device. In the above-described structure, the package may have a substrate; and the built-in semiconductor device may be face-down mounted on the substrate. In the above-described structure, the package may have a substrate; and the built-in semiconductor device may be face-up mounted on the substrate. In the above-described structure, the package may have a lead frame; and the built-in semiconductor device may be sealed with resin.

According to a fourth aspect of the present invention, there is provided a method of manufacturing a semiconductor device including: forming first grooves on an upper face of a semiconductor wafer; forming a first insulating layer that covers the upper face of the semiconductor wafer and side faces of the first grooves, and has second grooves that are formed in the first grooves and has concavities on side faces thereof, forming first metal layers on side faces of the concavities; and dividing the semiconductor wafer into a plurality of semiconductor chips by removing a bottom portion of the semiconductor wafer until the removal reaches bottom faces of the second grooves.

In the above-described method, forming the first insulating layer may include: forming an insulating film on the upper face of the semiconductor wafer; and forming the second grooves that have the concavities formed in the insulating film. The second grooves and the concavities can be easily formed.

In the above-described method, forming the first insulating layer may include: forming the first insulating layer that has openings on pad electrodes formed on the semiconductor wafer; and forming the first metal layers may include forming the first metal layers that are formed on an upper face of the first insulating layer and are connected to the pad electrodes through the openings. The circuits formed on the semiconductor chips and the second metal layers can be electrically connected via the first metal layers.

In the above-described method, forming the first metal layers may include forming the first metal layers on an upper face of the first insulating layer; and the method may further include forming a second insulating layer on upper faces of the first metal layers. Electric contact between the upper semiconductor chip of the stacked semiconductor chips and the first metal layers can be prevented.

In the above-described method, forming the first metal layers may include forming the first metal layers at center portions of inner side faces of the concavities. The first meal layers can be prevented from coming off.

According to a fifth aspect of the present invention, there is provided a method of manufacturing a semiconductor device including: forming first grooves on an upper face of a semiconductor wafer; forming a first insulating layer that covers the upper face of the semiconductor wafer and side faces of the first grooves, and has second grooves that are formed in the first grooves, forming first metal layers on an upper face and side faces of the first insulating layer; forming a second insulating layer that covers the upper face of the first insulating layer and side faces of the second grooves, and has third grooves that are formed in the second grooves and has concavities on side faces thereof, with the first metal layers being exposed through the concavities; and dividing the semiconductor wafer into a plurality of semiconductor chips by removing a bottom portion of the semiconductor wafer until the removal reaches bottom faces of the third grooves.

In the above-described method, forming the second insulating layer may include: forming an insulating film on the semiconductor wafer; and forming the third grooves that have the concavities formed in the insulating film. The second grooves and the concavities can be easily formed.

The above-described method may further include: stacking a plurality of semiconductor chips that include at least one semiconductor chip divided from the semiconductor wafer; and forming second metal layers in the concavities, the first metal layers being connected to the second metal layers. The second metal layers to be connected to the respective first metal layers can be easily formed by carrying out a squeegee process with silver paste and filling the concavities with the silver paste.

In the above-described method, forming the second metal layers may include forming the second metal layers by an electroless plating technique. The second metal layers can be formed so that the respective first metal layers are connected the second metal layers.

As described above, the present invention provides a semiconductor device that has metal layers that are formed on the side faces of stacked semiconductor chips at low costs, and electrically connect the semiconductor chips. The present invention also provides a method of manufacturing such a semiconductor device.

Although the preferred embodiments of the present invention have been described so far, the present invention is not limited to the above specific examples, and various changes and modifications may be made to them within the scope of the present invention.

The invention claimed is:

1. A method of manufacturing a semiconductor device comprising:
   forming first grooves on an upper face of a semiconductor wafer;
   forming a first insulating layer that covers the upper face of the semiconductor wafer and side faces of the first grooves, and has second grooves that are formed in the first grooves and has concavities on side faces thereof,
   forming first metal layers on side faces of the concavities; and dividing the semiconductor wafer into a plurality of semiconductor chips by removing a bottom portion of the semiconductor wafer until the removal reaches bottom faces of the second grooves.

2. The method as claimed in claim 1, wherein forming the first insulating layer includes:
   forming an insulating film on the upper face of the semiconductor wafer; and
   forming the second grooves that have the concavities formed in the insulating film.

3. The method as claimed in claim 2, wherein:
   forming the first insulating layer includes forming the first insulating layer that has openings on pad electrodes formed on the semiconductor wafer; and
      forming the first metal layers includes forming the first metal layers that are formed on an upper face of the first insulating layer and are connected to the pad electrodes through the openings.

4. The method as claimed in claim 2, wherein:
   forming the first metal layers includes forming the first metal layers on an upper face of the first insulating layer; and
   the method further includes forming a second insulating layer on upper faces of the first metal layers.

5. The method as claimed in claim 2, wherein forming the first metal layers includes forming the first metal layers at center portions of inner side faces of the concavities.

6. The method as claimed in claim 2, further comprising:
   stacking a plurality of semiconductor chips that include at least one semiconductor chip divided from the semiconductor wafer; and
   forming second metal layers in the concavities, the first metal layers being connected to the second metal layers.

7. The method as claimed in claim 6, wherein forming the second metal layers includes forming the second metal layers by an electroless plating technique.

8. A method of manufacturing a semiconductor device comprising:
   forming first grooves on an upper face of a semiconductor wafer;
   forming a first insulating layer that covers the upper face of the semiconductor wafer and side faces of the first grooves, and has second grooves that are formed in the first grooves,
   forming first metal layers on an upper face and side faces of the first insulating layer;
   forming a second insulating layer that covers the upper face of the first insulating layer and side faces of the second grooves, and has third grooves that are formed in the second grooves and has concavities on side faces thereof, with the first metal layers being exposed through the concavities; and
   dividing the semiconductor wafer into a plurality of semiconductor chips by removing a bottom portion of the semiconductor wafer until the removal reaches bottom faces of the third grooves.

9. The method as claimed in claim 8, wherein:
   forming the second insulating layer includes:
   forming an insulating film on the semiconductor wafer; and
   forming the third grooves that have the concavities formed in the insulating film.

* * * * *